United States Patent [19]

Matsuo et al.

[11] Patent Number: 4,904,515

[45] Date of Patent: Feb. 27, 1990

[54] HEAT-TREATMENT MEMBER FOR SEMICONDUCTOR ELEMENTS

[75] Inventors: Shuitsu Matsuo, Atsugi; Yoshinobu Tanada, Yoshinobu; Yasumi Sasaki, Nagai, both of Japan

[73] Assignee: Toshiba Ceramics Company, Limited, Tokyo, Japan

[21] Appl. No.: 199,790

[22] Filed: May 27, 1988

[51] Int. Cl.$^4$ ................................................. B44C 1/26
[52] U.S. Cl. ....................................... 428/67; 428/76; 428/333; 428/446; 428/698; 118/500; 422/248; 422/249
[58] Field of Search .................. 118/500; 428/698, 67, 428/76, 333, 446, 907; 422/248, 249

[56] References Cited

U.S. PATENT DOCUMENTS

| | | | |
|---|---|---|---|
| 3,634,116 | 1/1972 | Woerner et al. | 428/698 |
| 3,951,587 | 4/1976 | Alligro et al. | 432/253 |
| 4,499,147 | 2/1985 | Epomoto et al. | 428/698 |
| 4,710,428 | 12/1987 | Tamamizu et al. | 428/698 |
| 4,767,666 | 8/1988 | Bunshah et al. | 428/698 |
| 4,781,970 | 11/1988 | Bachee et al. | 428/698 |
| 4,804,589 | 2/1989 | Matsui et al. | 428/698 |

FOREIGN PATENT DOCUMENTS 62-122212 6/1987 Japan .

*Primary Examiner*—Ellis P. Robinson
*Assistant Examiner*—P. J. Ryan
*Attorney, Agent, or Firm*—Foley & Lardner, Schwartz, Jeffery, Schwaab, Mack, Blumenthal & Evans

[57] ABSTRACT

A semiconductor element heat-treatment member has a Si-SiC body and a $SiO_2$ coating formed on the surface of the Si-SiC body so as to cover the Si-SiC body. The $SiO_2$ coating has a thickness ranging between 20Å and 100,000Å.

7 Claims, No Drawings

HEAT-TREATMENT MEMBER FOR SEMICONDUCTOR ELEMENTS

BACKGROUND OF THE INVENTION

This invention relates to a member that supports or contains semiconductor elements during a process that involves the heat-treatment of the elements. Conventional Si-SiC members for the heat-treating of semiconductor elements present the drawback that impurities contained in constituent SiC particles or Si contaminate semiconductor elements during heat treatment. Also, when semiconductor elements are subjected to a heat-treatment, SiC is oxidized so as to produce CO or $CO_2$.

SUMMARY OF THE INVENTION

It is an object of this invention to provide a member for the heat treatment of semiconductor elements in which treated semiconductor elements are not easily contaminated.

It is also an object of the present invention to provide a heat-treatment member for semiconductor elements that can be used, in a conventional manner, without the generation of unwanted amounts of CO or $CO_2$.

In accomplishing these objects, there has been provided, in accordance with one aspect of the present invention, a semiconductor elements heat-treatment member comprising a body consisting essentially of Si and SiC and, provided on a surface of that body, a coating comprised of $SiO_2$ ranging in thickness between about 20 Å (Angstroms) and 100,000 Å, whereby the $SiO_2$ coating can trap the impurities. In a preferred embodiment, the heat-treatment member is provided with a $SiO_2$ coating over its entire surface.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

In accordance with the present invention, a body consisting essentially of Si and SiC is provided, on at least one surface thereof, with an $SiO_2$ coating characterized by a thickness within the above-prescribed range, more preferably between about 100 Å and 20,000 Å. If the thickness of the $SiO_2$ coating is less than 20 Å, the $SiO_2$ coating cannot effectively trap impurities migrating out of the Si-SiC body when semiconductor elements are subjected to a heat-treatment. The elements contained in the Si-SiC body thus become contaminated.

If the thickness of the $SiO_2$ coating is more than 100,000 Å, the $SiO_2$ coating tends to crack due to the difference in thermal expansion between Si-SiC body and $SiO_2$ coating during the heat-treatment step. In this case, the impurities can spread in a furnace so that semiconductor elements become contaminated. If the $SiO_2$ coating is cracked, moreover, $SiO_2$ particles can be produced, so that the atmosphere in the furnace is also contaminated.

The configuration of a heat-treatment member within this invention is not crucial, so long as the member can serve its function of supporting one or more semiconductor elements ("wafers") during a heating step. For example, a heat-treatment member of the present invention can be a process tube or linear tube which receives a wafer-supporting tray or "boat" in such a way as to protect the wafers against impurities and to conduct heat uniformly. A member within this invention can also be a wafer boat which supports semiconductor elements within a process tube or linear tube.

Since a $SiO_2$ coating is formed on a surface of a Si-SiC body, pursuant to the present invention, SiC in the body can be prevented from being oxidized while semiconductor elements are subjected to a heat-treatment. Accordingly, CO or $CO_2$ is not produced, and the elements are not contaminated by C.

The diffusion speed of impurities is very slow in $SiO_2$ in comparison with Si-SiC. Therefore, the $SiO_2$ coating can effectively trap the impurities migrating out of SiC particles and Si parts when the elements are heated.

The invention will be more clearly understood with reference to the following examples:

EXAMPLES (1)–(8)

93 wt. % of SiC powder having an average particle size of 13 microns was mixed with 7 wt. % of phenol resin thereby to make a mixture. The mixture was granulated so as to have an average particle size of 0.8 microns or less, and then was shaped in a predetermined form by a rubber press means under a pressure of 2,000 kg/cm², thereby to obtain a shaped body. After the shaped body was baked at 800° C. for 20 hours, it was impregnated with silicon by reacting fused silicon to obtain a Si-SiC body comprising 15 wt. % of Si and 85 wt. % of SiC. The Si-SiC body was further machined to form it in the shape of a boat for semiconductor diffusion furnace. After that, the Si-SiC body was heated in the presence of steam, at a temperature ranging between 800° C. and 1,000° C., to form a $SiO_2$ coating having a predetermined thickness on a surface of the boat-shaped Si-SiC body.

As shown in Table 1, various thickness of the $SiO_2$ coating were obtained by changing the period of time for heating the Si-SiC body.

TABLE 1

| Boats | Thickness of $SiO_2$ Coating | $|V_{FB}|$ |
| --- | --- | --- |
| Comparative Example 1 | 10 (Å) | 2.0 (V) |
| Example 2 | 20 | 1.8 |
| Example 3 | 30 | 1.0 |
| Example 4 | 500 | 0.2 |
| Example 5 | 20,000 | 0.7 |
| Example 6 | 90,000 | 1.5 |
| Comparative Example 7 | 110,000 | 2.0 |
| Comparative Example 8 | — | 0.2 |

In Table 1, $|V_{FB}|$ designates degree of contamination due to impurities.

Ten wafers of 5-inch type having N(100) were oxidized by means of a process tube and a boat which were made, respectively, of a pure silica glass, thereby to form an oxide film ($SiO_2$). The wafers were heated at 1,100° C. for 120 minutes, within a pure silica glass process tube in a non-oxidizing atmosphere (argon), while the wafers were supported in a boat produced as described in Examples (1) to (7), respectively, shown in Table 1.

The wafers were vapor-deposited with aluminum so as to form an aluminum electrode on a surface of the oxide film. After that, each $|V_{FB}|$ thereof was measured. The experimental results are shown in Table 1.

In Comparative Example (8), the same wafers as those of the Examples (1) to (7) were subjected to the same treatments while the wafers were supported by a boat made of a pure silica glass.

Examples (2) to (6) are within the scope of this invention, while Examples (1), (7) and (8) are only comparative examples which this invention does not cover.

EXAMPLES (9)–(12)

93 wt. % of SiC powder having an average particle size of 13 microns was mixed with 7 wt. % of phenol resin thereby to make a mixture. The mixture was granulated so as to have an average particle size of 0.8 microns or less and then shaped in a predetermined form by a rubber press means under a pressure of 2,000 kg/cm$^2$, thereby to obtain a shaped body. After the shaped body was baked at 800° C. for 20 hours, it was impregnated with silicon by reacting fused silica thereby to obtain a Si-SiC body comprising 15 wt. % of Si and 85 wt. % of SiC. The Si-SiC body was further machined to form it in the shape of a process tube for a semiconductor diffusion furnace. The process tube had an outer diameter of 200 mm, a thickness of 7 mm and length of 2,000 mm. The Si-SiC body was further subjected to steam oxidation, as described above, at a temperature ranging between 800° C. and 1,000° C., so as to form a SiO$_2$ coating having a predetermined thickness over the whole surface of the Si-SiC body. As shown in Table 2, various thickness of the SiO$_2$ coating were produced by changing the period of time for heating the Si-SiC body.

TABLE 2

| Process Tubes | Thickness of SiO$_2$ Coating (angstroms) | Elemental Impurities* | | | |
|---|---|---|---|---|---|
| | | Fe | Na | Cu | Al |
| Comparative Example 9 | 15 | 100 | 30 | 10 | 10 |
| Example 10 | 25 | 20 | 5 | 1 | 3 |
| Example 11 | 100 | 6 | 0.9 | 0.5 | 1 |

TABLE 2-continued

| Process Tubes | Thickness of SiO$_2$ Coating (angstroms) | Elemental Impurities* | | | |
|---|---|---|---|---|---|
| | | Fe | Na | Cu | Al |
| Example 12 | 500 | 5 | 1 | 0.2 | 0.8 |

*× 10$^{15}$ atoms/cm$^3$

Ten wafers of five-inch type were set in each process tube and subjected to a heat-treatment at 1,200° C. in an oxidizing atmosphere until an oxide film (SiO$_2$) had about 1,000 Å. The experimental results of each oxide film are shown in Table 2. Fe, Na, Cu and Al are impurities contained in the oxide film.

While a preferred embodiment has been described, variations thereto will occur to those skilled in the art within the scope of the present inventive concepts which are delineated by the following claims. For example, while a coating over the entire surface of the heat-treatment member is preferred, a member carrying a SiO$_2$ coating on only that portion of its surface in contact or close proximity with the semiconductor element(s) can also be suitable.

What is claimed is:

1. A heat-treatment member for semiconductor elements, comprising a body consisting essentially of Si and SiC and, provided on a surface of said body, a coating consisting essentially of SiO$_2$ which ranges in thickness between about 20 Å and 100,000 Å.

2. A semiconductor elements heat-treatment member of claim 1, wherein the thickness of the SiO$_2$ coating ranges between 100 Å and 20,000 Å.

3. A semiconductor elements heat-treatment member of claim 1, wherein the coating is provided over the entire surface of the body.

4. A semiconductor elements heat-treatment member of claim 1, wherein the member is a boat for semiconductor diffusion furnace.

5. A semiconductor elements heat-treatment member of claim 1, wherein the member is a process tube for semiconductor diffusion furnace.

6. A semiconductor elements heat-treatment member of claim 1, wherein the body consists essentially of about 15 wt. % of Si and about 85 wt. % of SiC.

7. A semiconductor elements heat-treatment member of claim 1, wherein said coating is formed by heating said body, in the presence of steam, to a temperature ranging from 800° C., such that an SiO$_2$ coating is produced by oxidation of said body.

* * * * *